(12) United States Patent
Wildhagen

(10) Patent No.: US 7,161,979 B2
(45) Date of Patent: Jan. 9, 2007

(54) DIGITAL FILTER FOR IQ-GENERATION, NOISE SHAPING AND NEIGHBOR CHANNEL SUPPRESSION

(75) Inventor: Jens Wildhagen, Weinstadt (DE)

(73) Assignee: Sony Deutschland GmbH, Cologne (DE)

( * ) Notice: Subject to any disclaimer, the term of this patent is extended or adjusted under 35 U.S.C. 154(b) by 857 days.

(21) Appl. No.: 09/863,487

(22) Filed: May 23, 2001

(65) Prior Publication Data

US 2002/0012389 A1 Jan. 31, 2002

(30) Foreign Application Priority Data

May 24, 2000 (EP) .................................. 00111193

(51) Int. Cl.
*H04L 7/30* (2006.01)
*H04L 27/20* (2006.01)

(52) U.S. Cl. ..................... 375/229; 375/308; 708/313
(58) Field of Classification Search ............... 375/229, 375/240.1, 240.11, 240.19, 240.29, 280, 377, 375/232, 279, 281, 308, 324, 329, 331, 332, 375/340; 341/61; 708/300, 313, 322, 323; 329/103; 332/304
See application file for complete search history.

(56) References Cited

U.S. PATENT DOCUMENTS

| | | | |
|---|---|---|---|
| 5,504,455 A | | 4/1996 | Inkol |
| 5,592,517 A | * | 1/1997 | Camp et al. ................. 375/350 |
| 5,657,261 A | * | 8/1997 | Wilson et al. ............... 708/313 |
| 6,023,717 A | | 2/2000 | Argyroudis |
| 6,134,569 A | * | 10/2000 | Kot ............................. 708/313 |
| 6,141,372 A | * | 10/2000 | Chalmers .................... 375/147 |
| 6,531,969 B1 | * | 3/2003 | Chu ............................. 341/61 |

FOREIGN PATENT DOCUMENTS

| | | |
|---|---|---|
| DE | 4402632 | 8/1995 |
| GB | 2282303 A  * | 3/1995 |

OTHER PUBLICATIONS

Kale I et al: "High Resolution Data Conversion Via Sigma-Delta Modulators and Polyphase Filters: A Review" Measurement, GB, Institute of Measurement and Control. London, vol. 19, No. 3, Nov. 1, 1996, pp. 159-168, XP004059591.

Harris F et al "Oversampled Digital to Analog Converters With Very Small Computational Load" Proceedings of the Asilomar Conference on Signals, Systems and Computers, US, Los Alamitos, IEEE Comp. Soc. Press, vol. Conf. 25, Nov. 4, 1991, pp. 429-433, XP000312760.

* cited by examiner

*Primary Examiner*—Betsy L. Deppe
(74) *Attorney, Agent, or Firm*—Frommer Lawrence & Haug LLP; William S. Frommer; Thomas F. Presson

(57) ABSTRACT

A polyphase filter of order x·N that builds N allpass filters of order x·N has a structure of an allpass filter of order x comprising delay elements with a delay of 1 and at least one multiplier, wherein all delay elements with a delay of 1 are replaced by delay elements with a delay of N and the sampling rate of fS'=fs/N with fs being the sampling rate of the input signal. Preferably the multiplier included in the structure of the allpass filter of order x comprises N-time multiplex multiplication coefficients that are used in a predetermined order.

10 Claims, 10 Drawing Sheets

DIGITAL FILTER FOR IQ-GENERATION, NOISE SHAPING AND NEIGHBOR CHANNEL SUPPRESSION

FEILD OF THE INVENTION

The present invention relates to the digital generation of a complex baseband signal and in particular to an efficient realization of a polyphase-filter which can be used therefore and also for other purposes.

BACKGROUND OF THE INVENTION

The German Patent Application DE 43 32 735 A1 "Verfahren zur digitalen Erzeugung eines komplexen Basisbandsignals" describes an algorithm for the generation of a complex baseband signal which makes use of a polyphase-filter. This Patent Application also describes that the branch filters of the polyphase-filter should be realized as allpass filters.

The paper "Entwurf und Realisierung diskreter Filterbänke", published by Shaker, ISBN 3-8265-0366-X, from Torsten Leickel explains how to design such polyphase-filters with allpass branch filters.

The design of polyphase filters with allpass branch filters is well known in the art.

In prior systems, the input signal of the polyphase-filter is multiplexed into N different ailpass filters. Therefore, N ailpass filters have to be realized with N being the decimation factor of the polyphase filter. This design leads to high realization costs for the polyphase-filter. Also, only a restricted amount of IF-frequencies can be realized with this structure, since the IF-frequencies can only be chosen to $F_{IF}=M \cdot F + L \cdot F/N$ with F being the sampling rate of the filter input signal, L being a natural constant between $$\frac{-N-1}{2} \ldots \frac{N-1}{2}$$

and m being a natural constant.

Further, EP 0 597 255 A1 "Empfänger für ein digitales Rundfunksignal mit digitaler Signalverarbeitung" discloses an efficient realization of an algorithm for the generation of a complex baseband signal. To optimize the realization of the digital signal processing a switchable allpass filter is used. However, this realization has the disadvantage that no digital neighbour channel suppression/noise shaping can be realized and the IF-frequency can only be chosen to $F_{IF}=m \cdot F \pm F/4$ with F being the IQ-filter input sampling rate and m being a natural constant.

The disadvantage of using switchable ailpass filters is that no digital channel suppression/noise shaping can be realized. Furthermore, the IF frequency can only be chosen to be $F_{IF}=m \cdot F \pm (F/4)$ with F being the IQ filter input sampling rate and m being a natural constant.

However, prior IQ-generators are quite restricted in respect to the used Intermediate Frequency (IF) and in respect to possible sampling frequencies of the A/D converter converting the IF signal into a signal suitable for digital baseband processing since the output frequency of the generation is fixed according to certain standards and the input frequency of the IQ generation (i.e., the IF frequency) strongly depends on the used IQ-filter and the needed output frequency.

BRIEF SUMMARY OF THE INVENTION

Therefore, it is an object underlying the present invention to provide a polyphase-filter which can be used for the IQ-generation and an IQ-generator providing an increased number of possible Intermediate Frequencies, i. e. more flexibility in the choosing of the sampling frequency of the A/D converter preceding the IQ generation.

The polyphase filter according to the present invention has low realization costs, since only a very small amount of adders and multipliers are required. In a preferred embodiment every needed multiplier is realized by at least one shift register, at least one adder and at least on subtracter, so that the realization costs are additionally decreased.

Furthermore, the using of a multiplexing technology allows a very easy adaptation to a different "number" of branch filters and therewith to a different IF frequency.

The IQ generator according to the present invention allows a very easy doubling of possible Intermediate Frequencies for a given polyphase filter consisting of N branch allpass filters of order x·N used therein, since signal symmetrics are used in an efficient way.

Preferably, the IQ-generator according to the present invention comprises a polyphase filter according to the present invention which allows to replace the expensive analog filters in front of the A/D-converter by weak, cheap filters, since the polyphase filter according to the present invention allows a noise shaping and neighbour channel suppression in an easy way so that the effective resolution of the A/D-converter will be increased.

The present invention which uses and modifies the structure of conventional allpass filters first order to realize a polyphase filter of order x·N will be better understood from the following detailed description of exemplary embodiments thereof taken in conjunction with the accompanying drawings, wherein

DRIEF DESCRIPTION OF THE DRAWINGS

DETAILED DECRIPTION OF THE INVENTION

In the following the first preferred embodiment of a polyphase filter according to the present invention will be explained in connection with FIGS. 1 and 2.

Figure 2A:
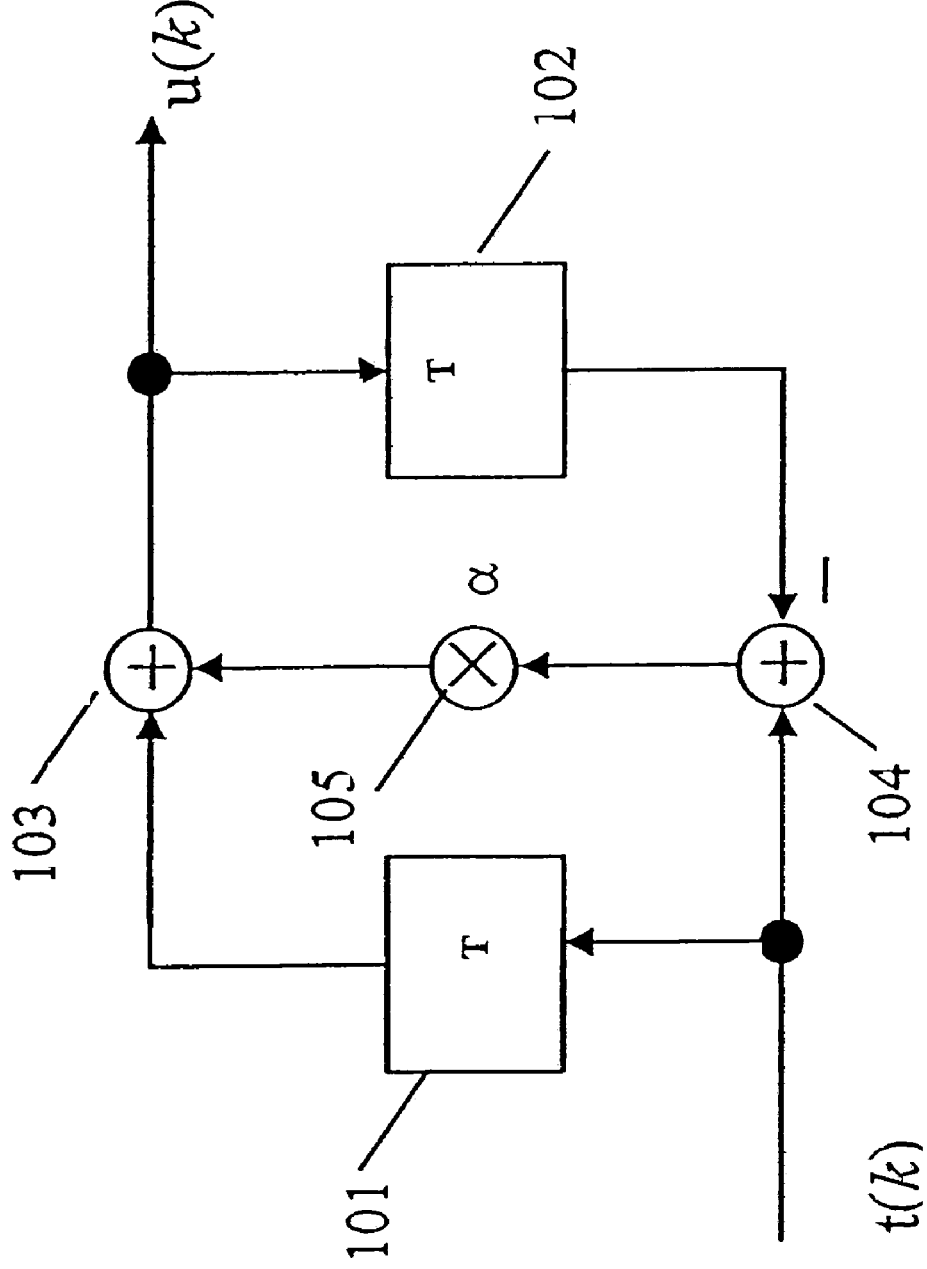
FIGS. 2a and 2b show how the design of the polyphase branch allpass filters of order N according to the first preferred embodiment of the present invention was achieved.

FIG. 2a shows a state of the art allpass filter of order 1 which comprises two delay elements 101 and 102, one adder 103, one subtracter 104 and one multiplier 105. Both delay elements have a delay T and the multiplier has a multiplication factor α. The structure of the state of the art allpass filter of order 1 shown in FIG. 2a is such that an input signal t(k) is fed to an input delay element 101 and as minuent to the subtracter 104. The delayed input signal output by the delay element 101 is input as a first summand to the adder 103 that produces and outputs the output signal u(k) of the allpass filter. The output signal u(k) is fed to an output delay element 102 which outputs the subtrahend for the subtracter 104. The difference calculated by the subtracter 104 gets multiplied with the multiplication factor α by the multiplier 105 and the resulting product is supplied as second summand to the adder 103 which adds its first and second summands to produce its output signal.

Equation (1) describes the transfer function of a polyphase lowpass filter with N filter branches, e. g. shown in "Multirate digital signal processing: multirate systems, filterbanks, wavelets", by N. J. Fliege, ISBN 0-471-93976-5:

$$H_{1p}(z) = \sum_{r=0}^{N-1} z^{-r} H_r(z^N) \tag{1}$$

with $z=e^{j\Omega}$ $$\Omega = 2\pi \frac{f}{f_s}$$

$$j = \sqrt{-1}$$

As described in the DE 43 32 735 A1 or the publication "A new design method for polyphase filters using allpass sections" by W. Drews & L. Garrsi, IEEE Transactions on Circuits and Systems, Vol. CAS33, No. 3, March 1986, the branch filters can be chosen as state of the art allpass filters. The transfer function of such an allpass filter of order 1 which is shown in FIG. 2a is given in equation (2).

$$H_{ap,1st\ order}(z) = \frac{U(z)}{T(z)} = \frac{\alpha + z^{-1}}{1 + \alpha z^{-1}} = \frac{\alpha z + 1}{z + \alpha} \tag{2}$$

With equations (1) and (2) follows the transfer function of a branch allpass filter of the polyphase filter with one coefficient as shown in equation (3):

$$H_r(z^N) = \frac{\beta_r z^N + 1}{z^N + \beta_r} \tag{3}$$

Therefore, with equations (1) and (3) follows the transfer function of the polyphase lowpass filter as shown in equation (4):

$$H_{1p}(z) = \sum_{r=0}^{N-1} z^{-r} \frac{\beta_r z^N + 1}{z^N + \beta_r} \tag{4}$$

To realize a polyphase lowpass filter with a transfer function as shown in equation (4) according to the present invention, the N branch allpass filters are realized time-multiplexed with a sampling rate of $f_s'=f_s/N$ with $f_s$ being the sampling rate of the polyphase filter input signal t(k).

Figure 2B:
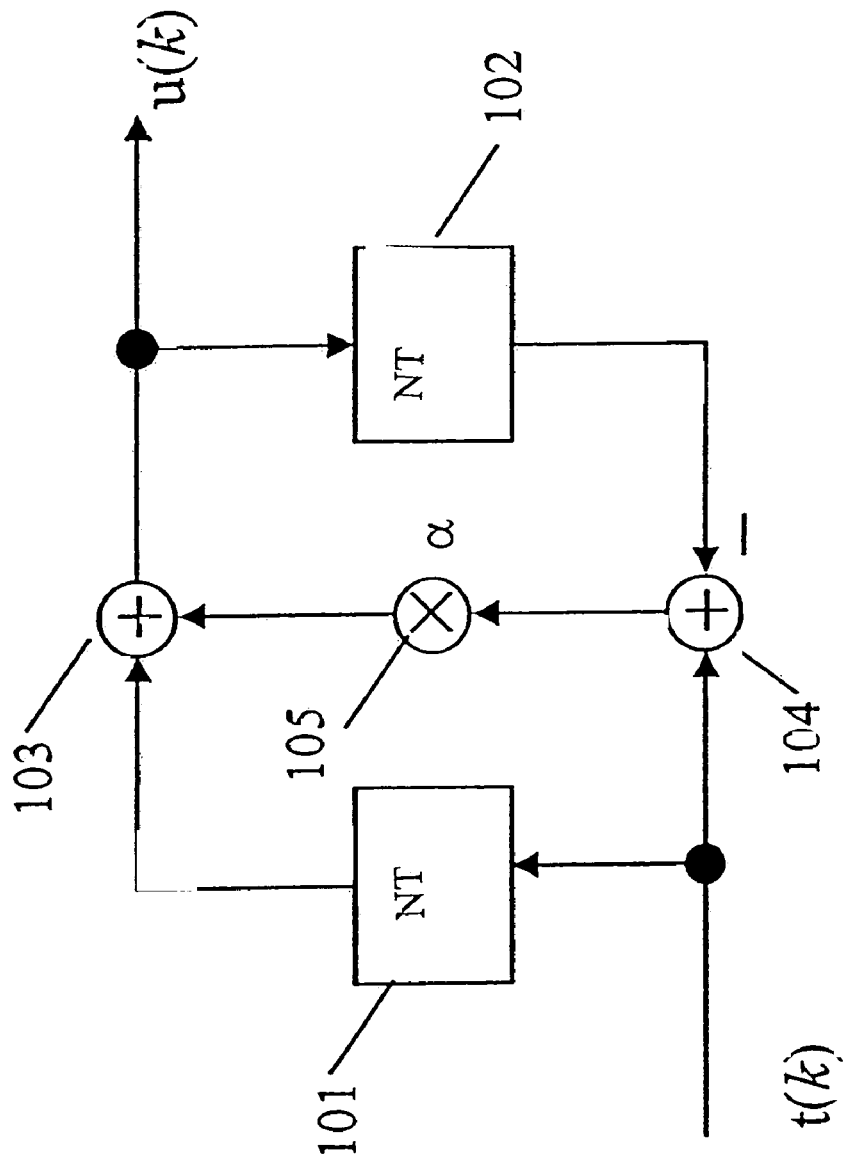

FIG. 2b shows the structure of these N time-multiplexed alipass filters of order N with a sampling rate of f.sub.s'=f.sub.s/N which is only different to the ailpass filter first order shown in FIG. 2a in that the delay elements now have delay NT and the sampling rate is decreased, since the sampling rate decimation by N at the output of the polyphase filter is shifted to the input of the branch filter.

The transfer function of each of the N time-multiplexed allpass filters is calculated as follows:

$$\text{With } f_s' = \frac{f_s}{N} \text{ and } \Omega' = 2\pi \frac{f}{f_s'} \text{ follows equation (5): } \Omega' = 2\pi \frac{Nf}{f_s} = N\Omega. \tag{5}$$

With $z'=e^{j\Omega'}$ and equation (5) follows equation (6):

$$z' = e^{j\Omega'} = e^{jN\Omega} = z^N \tag{6}$$

With equation (6) follows for the transfer function (7) of the N time-multiplexed allpass filters $N^{th}$ order in consideration of the delay caused by the time-multiplex:

$$H_{ap',1st\ order}(z^N) = \frac{U(z^N)}{T(z^N)} = z^{-r}\alpha z^N + \frac{1}{z^N + \alpha} \tag{7}$$

with r=0, 1, ... N−1.

In the preferred embodiment, additionally the coefficient α of the N time-multiplex allpass filters is replaced by N time-multiplexed coefficients $\alpha_0, \ldots \alpha_{N-1}$ as shown in equation (8):

$$\alpha(k) = \alpha_{(k\ mod\ N)} \tag{8}$$

The N time-multiplexed allpass filters of order N with the sampling rate $f_s'=f_s\cdot N$ included in the polyphase filter according to the first preferred embodiment of the present invention have now the following transfer functions as shown in equation (9):

$$H_{ap'_r,1st\ order}(z^N) = \frac{U(z^N)}{T(z^N)} = z^{-r}\alpha_r z^N + \frac{1}{z^N + \alpha_r} \tag{9}$$

with r=0, 1, ... N−1.

Figure 1:
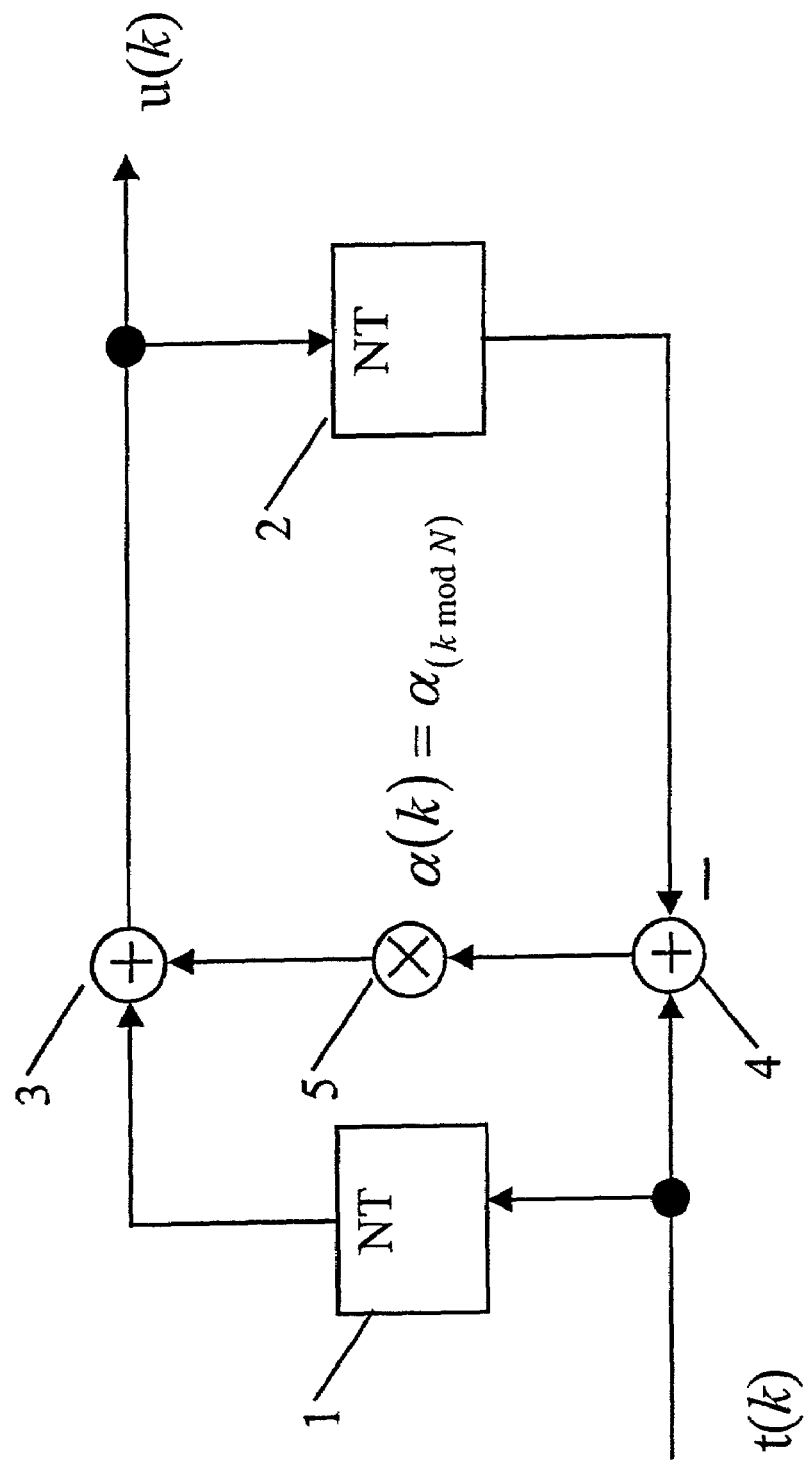
FIG. 1 shows a block diagram of the N time multiplexed branch allpass filters of the polyphase filter according to a first preferred embodiment of the present invention.

The block diagram of this polyphase branch filter realization according to the first preferred embodiment of the present invention is shown in FIG. 1 which basically shows the same structure as FIG. 2b, but the multiplier now comprises N time-multiplexed coefficients as described above.

Therefore, the polyphase filter according to the first preferred embodiment of the present invention comprises: a first delay element 1 with a delay NT that receives the input signal t(k); a first adder 3 that receives the output signal of said first delay element 1 at a first input for the first sun-imand; a second delay element 2 with a delay NT that receives the sum produced by said first adder 3; a first subtracter 4 that receives the input signal t(k) at a first input for the minuend and the output signal of the second delay element 2 at a second input for the subtrahend; and a first multiplier 5 that receives the calculated difference of the first subtracter 4, multiplies it respectively with a predetermined multiplication coefficient .alpha.(k) and outputs the calculated product to a second input of the first adder 3 that receives the second summand, wherein in the sum produced by said first adder 3 builds the output signal u(k) of the filter.

Figure 3:
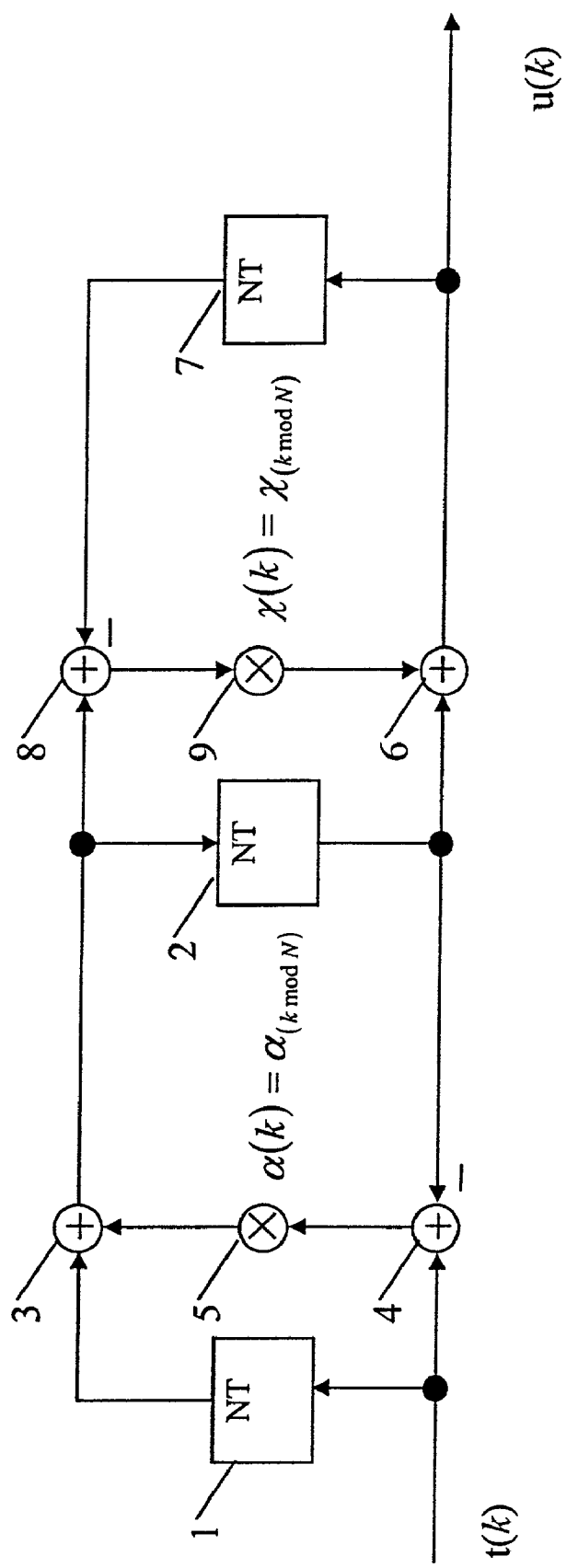
FIG. 3 shows polyphase branch allpass filters according to a second preferred embodiment of the present invention.

The allpass branch filters of the polyphase filters can of course be of higher order than of order 1. The following second preferred embodiment according to the present invention described in connection with FIGS. 3 and 4 shows how to create a polyphase lowpass filter with branch filters second order from a state of the art allpass filter second order.

Figure 4:
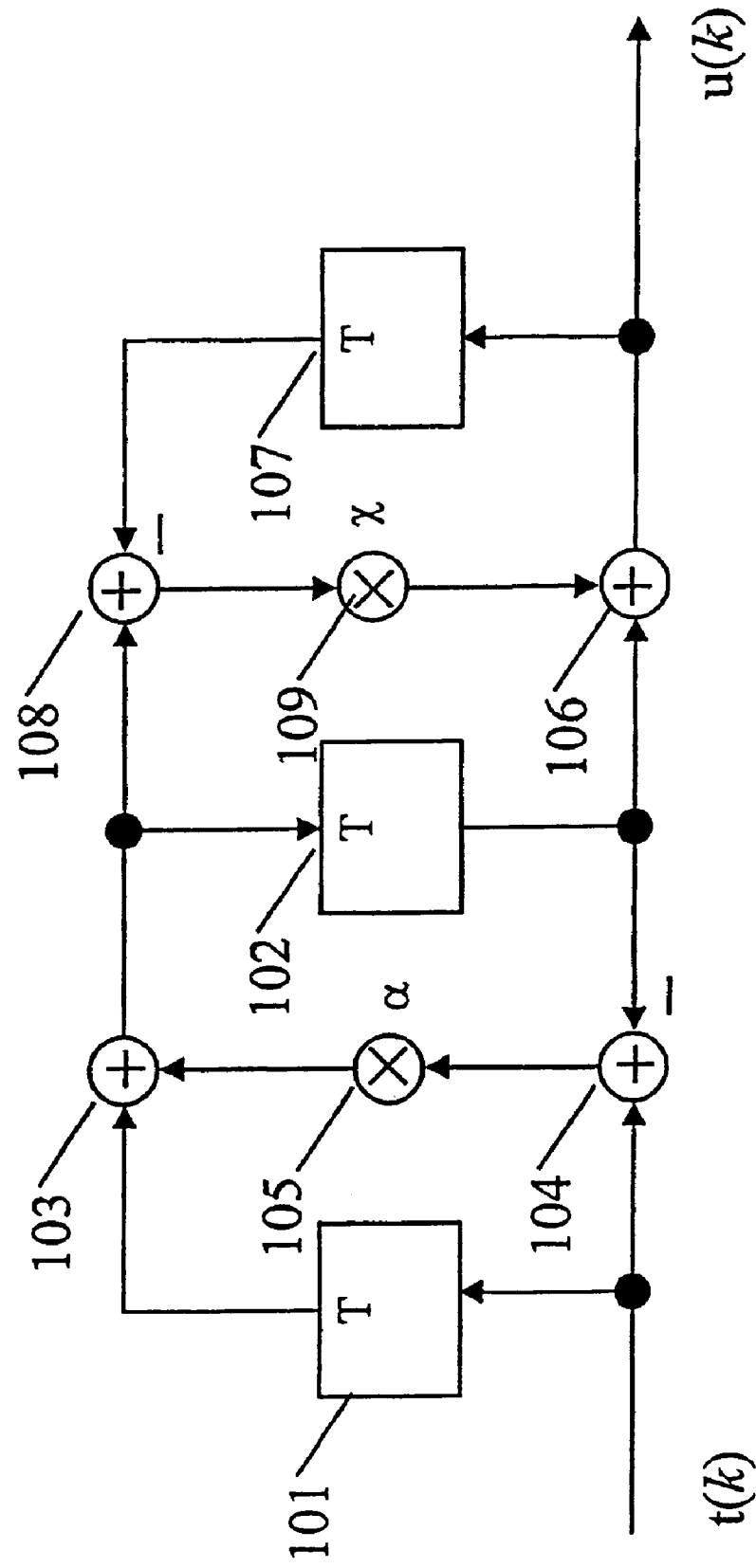
FIG. 4 shows how the design of the polyphase filter according to the second preferred embodiment of the present invention was achieved.

Such state of the art allpass filter second order is shown in FIG. 4. The difference to the state of the art allpass filter first order shown in FIG. 2a is that the output signal u(k) is not the sum generated by first adder 103, but a second filter stage follows to generate this signal. Therefore, the output signal u(k) is generated as a sum signal of a further adder 106 that receives the output signal of the output delay element 102 as a first summand. The second summand of said further adder 106 is generated by multiplying the difference of the sum signal produced by the adder 103 and the delayed output signal u(k) by a multiplication factor $\chi$ with a further multiplier 109. The time delayed output signal u(k) is generated by a second output delay element 107.

The transfer function of such an allpass filter second order is shown in equation (11):

$$H_{ap,2^{nd}\ order}(z) = \frac{U(z)}{T(z)} = \frac{\alpha z + 1}{z + \alpha} \cdot \frac{\chi z + 1}{z + \chi} \tag{11}$$

Therefore, with the transfer function of a polyphase lowpass filter described in equation (1), the transfer function for the polyphase allpass branch filters with 2 coefficients follows as shown in equation (12):

$$H_r(z^N) = \frac{\beta_r z^N + 1}{z^N + \beta_r} \cdot \frac{\delta_r z^N + 1}{z^N + \delta_r} \tag{12}$$

With equations (1) and (12) follows for the transfer function of the polyphase lowpass filter the following equation (13):

$$H_{1p}(z^N) = \sum_{r=0}^{N-1} z^{-r} \beta_r z^N + \frac{1}{z^N + \beta_r} \cdot \frac{\delta_r z^N + 1}{z^N + \delta_r} \tag{13}$$

For the polyphase lowpass filter with branch allpass filters of order 2·N according to the present invention follows that all delay elements of order 1 shown in FIG. 4 have to be replaced with delay elements of order N and the sampling rate of each branch input signal is changed to fs'=fs/N with fs being the sampling rate of the input signal t(k).

According to the second preferred embodiment of the present invention the polyphase filter with branch filters of order 2·N additionally respectively comprises N time-multiplex coefficients .alpha..sub.r and .chi..sub.r with r=0, 1, ... N−1 instead of the coefficients .alpha. and .chi. shown in FIG. 4. Therefore, the polyphase filter according to the second embodiment of the present invention as shown in FIG. 3 comprises additionally to all components shown in FIG. 1: a second adder 6 that receives the output signal of the second delay element 2 at a first input for the first summand; a third delay element 7 with a delay NT that receives the sum produced by said second adder 6; a second subtracter 8 that receives the sum produced by said first adder 3 at a first input for the minuend and the output signal of the third delay element 7 at a second input for the subtrahend; and a second multiplier 9 that receives the calculated difference of the second subtracter 8, multiplies it respectively with a predetermined multiplication coefficient .chi.(k) and outputs the calculated product to a second input of the second adder 6 that receives the second summand, wherein the sum produced by said second adder 6 builds the output signal u(k) of the branch filters.

The transfer function of the N time-multiplexed allpass filters $2N^{th}$ order included in the polyphase filter according to the second preferred embodiment are given in the following equation (15):

$$H_{ap'_r,\ 2^{nd}\ order}(z) = z^{-r} \alpha_r z^N + \frac{1}{z^N + \alpha_r} \cdot \frac{\chi_r z^N + 1}{z^N + \chi_r} \tag{15}$$

with r=0, 1, ... N−1.

The coefficients of the N time-multiplexed allpass filters $2N^{th}$ order can be achieved by comparing equations (13) and (15). The coefficients $\alpha_r$ and $\chi_r$ of the N time-multiplexed allpass filters are the same as the coefficients $\beta_r$ and $\delta_r$ of the polyphase lowpass filter, as it is shown in equation (16):

$\alpha_r=\beta_r$ for r=0, 1, ..., N−1

$\chi_r=\delta_r$ for r=0, 1, ..., N−1 $\quad (16)$

It can be seen from both preferred embodiments according to the present invention described above that the present invention allows a very easy design of polyphase filters of order x·N consisting of N allpass filters of order x·N and having a desireable factor N. According to the present invention within the structure of an allpass filter of order x all delay elements with a delay 1 are replaced by delay elements with a delay N and so the input sampling rate of the branch filters is decreased to a sampling rate $f_s'=f_s/N$ with $f_s$ being the sampling rate of the input signal t(k) of the polyphase filter.

Preferably every multiplier included within the allpass filter of order x comprises N time-multiplexed multiplication coefficients that are used in a predetermined order, e. g. $a(k)=a_{(k\ mod\ N)}$.

Further preferably everyone of said multipliers has quantized coefficients so that it can be realized by at least one shift register, at least one adder and at least one subtracter.

An IQ-generator according to the present invention is described in connection with FIGS. 5 to 9.

Figure 5:
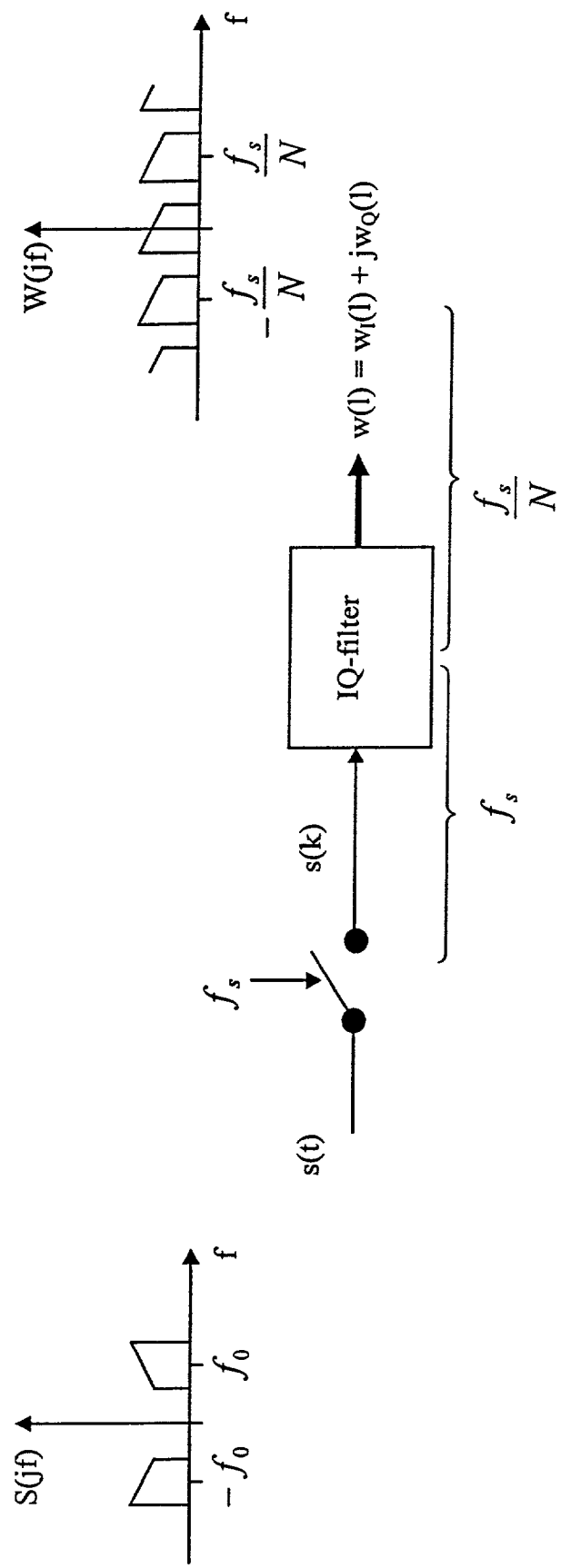
FIG. 5 shows a block diagram of the system environment of an IQ-filter.

FIG. 5 shows on the left hand side an analog bandpass signal s(t) with a center frequency $f_0$ which is sampled by an A/D-converter with a sampling rate $f_s$. The sampled bandpass signal s(k) is passed to a digital IQ-filter according to the present invention that mixes the sampled bandpass signal s(k) to a complex baseband signal, performs a sampling rate decimation with a decimation factor of N and a noise shaping which depends on the number of branch filters N of the polyphase filter. The output signal of the IQ-filter is the complex baseband signal $w(1)=w_I(1)+jw_Q(1)$ with a sampling rate of $f_s'=f_s/N$.

Figure 6:
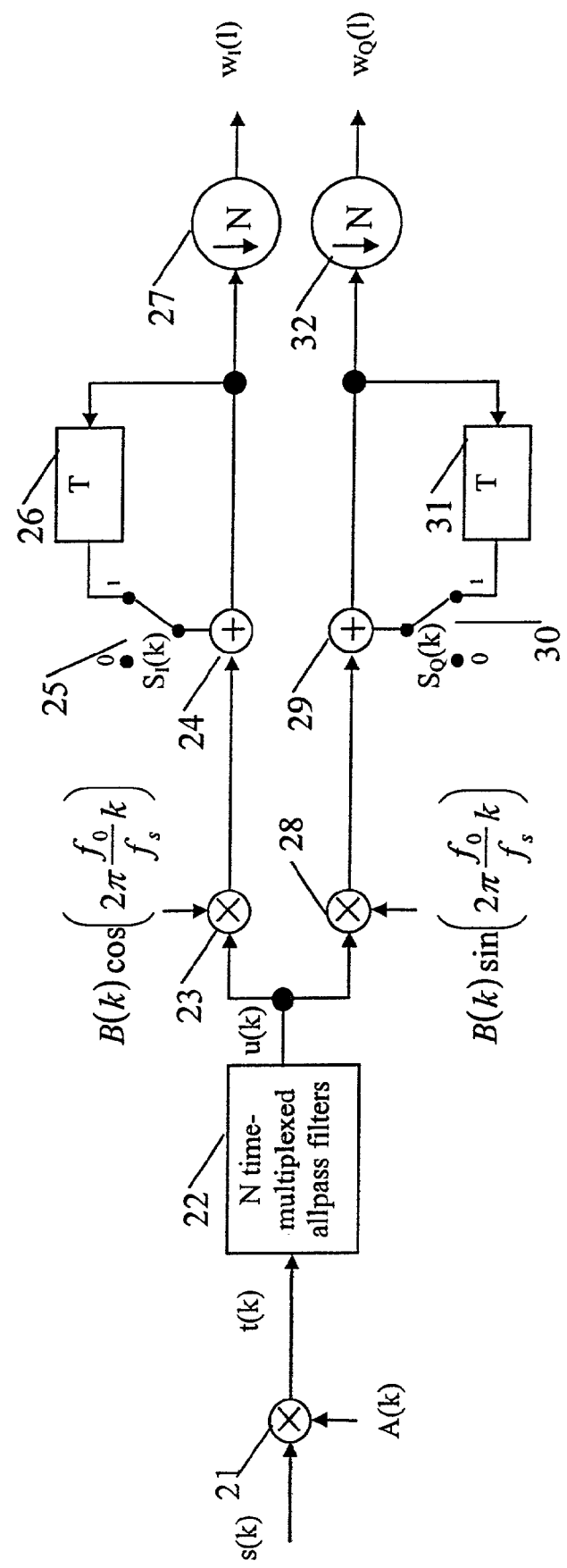
FIG. 6 shows a block diagram of a digital IQ-filter.

FIG. 6 shows the block diagram of the digital IQ-filter according to the present invention that includes a filter block 22 consisting of N time-multiplexed allpass filters according to the present invention. The incoming sampled bandpass signal s(k) gets multiplied with a signal A(k) by an multiplier 21 before the resulting signal t(k) is input to the N time multiplexed allpass filters 22 according to the present invention which outputs an output signal u(k). To generate the inphase component $w_I(1)$ of the complex baseband signal w(1) the output signal u(k) of the polyphase filter according to the present invention is subjected to a multiplication with the function $B(k) \cdot \cos(2\pi f_0/f_S \cdot k)$ in a multiplier 23 before it is supplied as a first summand to an adder 24 which receives its own output signal delayed by a delay element 26 with a delay T via a switch $S_I(k)$ 25 as second summand. The output signal of the adder 24 gets decimated by N in a sampling rate decimation unit 27 which outputs the in-phase component $w_I(1)$ of the complex baseband signal w(1). To generate the quadrature-component $w_Q(1)$ of the complex baseband signal w(1) the output signal u(k) of the polyphase filter according to the present invention is subjected to a multiplication with the funktion $B(k) \cdot \sin(2\pi f_0/f_S \cdot k)$ in a multiplier 28 before it is supplied as a first summand to an adder 29 which receives its own output signal delayed by a delay element 31 with a delay T via a switch $S_Q(k)$ 30 as second summand. The output signal of the adder 29 gets decimated by N in a sampling rate decimation unit 32 which outputs the quadrature component $w_Q(1)$ of the complex baseband signal w(1).

The switch $s_I(k)$ 25 for the inphase component of the complex baseband signal and the switch $S_Q(k)$ 30 for the quadrature component of the complex baseband signal are switched in the following way:

$$S_I(k) = S_Q(k) = \begin{cases} 0 & k \bmod N = 0 \\ & \text{for} \\ 1 & \text{else} \end{cases} \quad (17)$$

The center frequency $f_0$ of the A/D-converter input signal s(t) is given by equation (18) or (19):

$$f_0 = f_s\left(\frac{n \pm 0.5}{N} + m\right) \quad (18)$$

$$f_0 = f_s\left(\frac{n}{N} + m\right) \quad (19)$$

with N: decimation factor
n: integer in the range of $$\left[-\frac{N}{2}, \ldots, \frac{N}{2}\right]$$

m: integer

A(k) and B(k) must be chosen dependent on the center frequency of the A/D-converter input signal. In case of a center frequency $f_0$ calculated with equation (18) A(k) and B(k) are given by equation (20):

$$A(k) = B(k) = (-1)^{floor\left(\frac{k}{N}\right)} \quad (20)$$

In case of a center frequency $f_0$ calculated with equation (19) A(k) is given by equation (21):

$$A(k) = B(k) = 1 \quad (21)$$

In the special case of the following equation (22):

$$f_0 = f_s\left(\frac{1}{4} + m\right) \quad (22)$$

with m: integer, which is also called quarter period sampling, the carrier multiplication at the output of the modified allpass filter is not necessary. In this case, the block diagram shown in FIG. 6 can be reduced to the block diagram shown in FIG. 7.

Here, the output signal u(k) of the N time multiplexed allpass filters 22 according to the present invention is fed directly as a first summand to an adder 33 which outputs the IQ-multiplexed complex baseband signal $w(1)=w_I(1)+jw_Q(1)$. The adder 33 receives the IQ-multiplexed complex baseband signal delayed by two delay elements 35, 36 each having a delay T via a switch S7 34 as second summand. The switch 34 is switched in the following way:

$$S_7 = \begin{cases} 0 & k \bmod N = 0, 1 \\ & \text{for} \\ 1 & \text{else} \end{cases} \quad (23)$$

The output signal of the adder 33 gets decimated by N/2 in a sampling rate decimation unit 37 which outputs the multiplexed complex baseband signal w(1).

Depending on the required sideband for the IQ-generation, the factor A(k) is calculated by equation (24) or equation (25):

$$A(k) = (-1)^{floor\left(\frac{k}{2}\right)} \quad (24)$$

$$A(k) = (-1)^{floor\left(\frac{k-1}{2}\right)} \quad (25)$$

Figure 7:
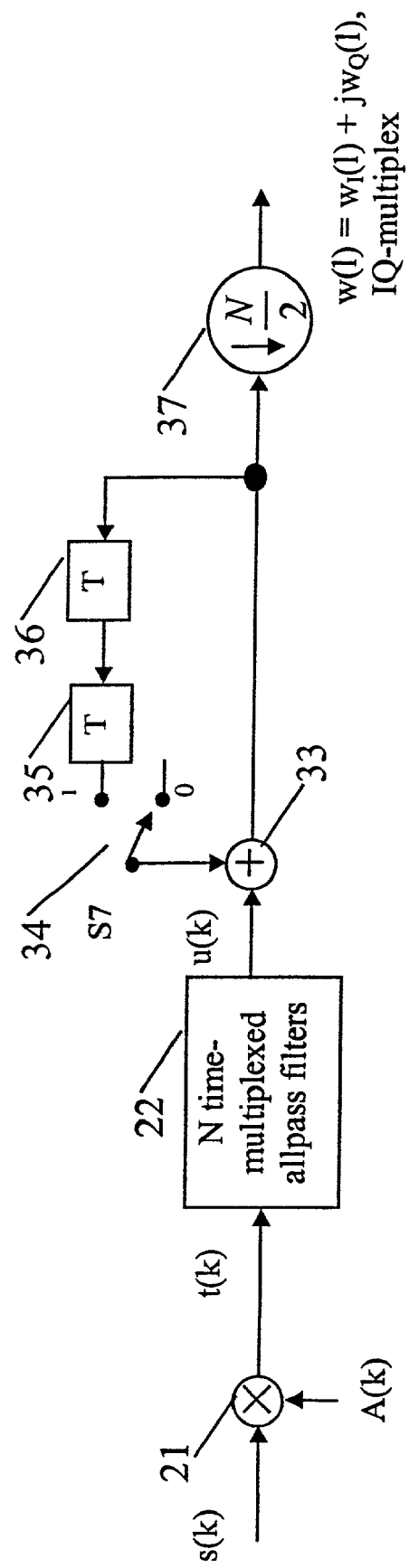
FIG. 7 shows a block diagram of a digital IQ-filter in case of quarter period sampling.

As mentioned above, the output signal of the IQ-filter described in FIG. 7 is the time-multiplexed complex baseband signal with a sampling rate of $f_s'=f_s/N$.

Figure 8:
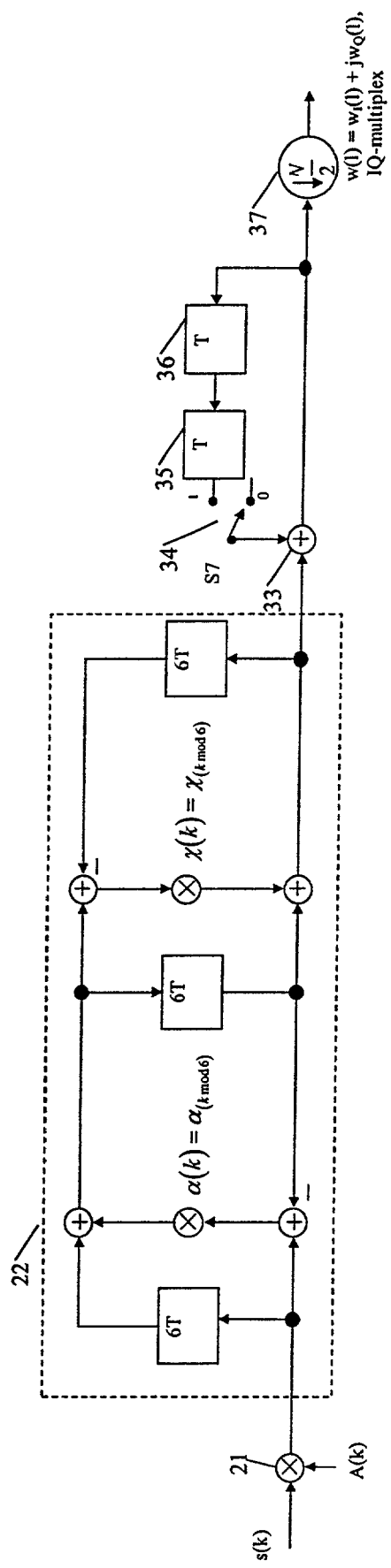
FIG. 8 shows a block diagram of the digital IQ-filter according to a preferred embodiment of the present invention.
Figure 9:
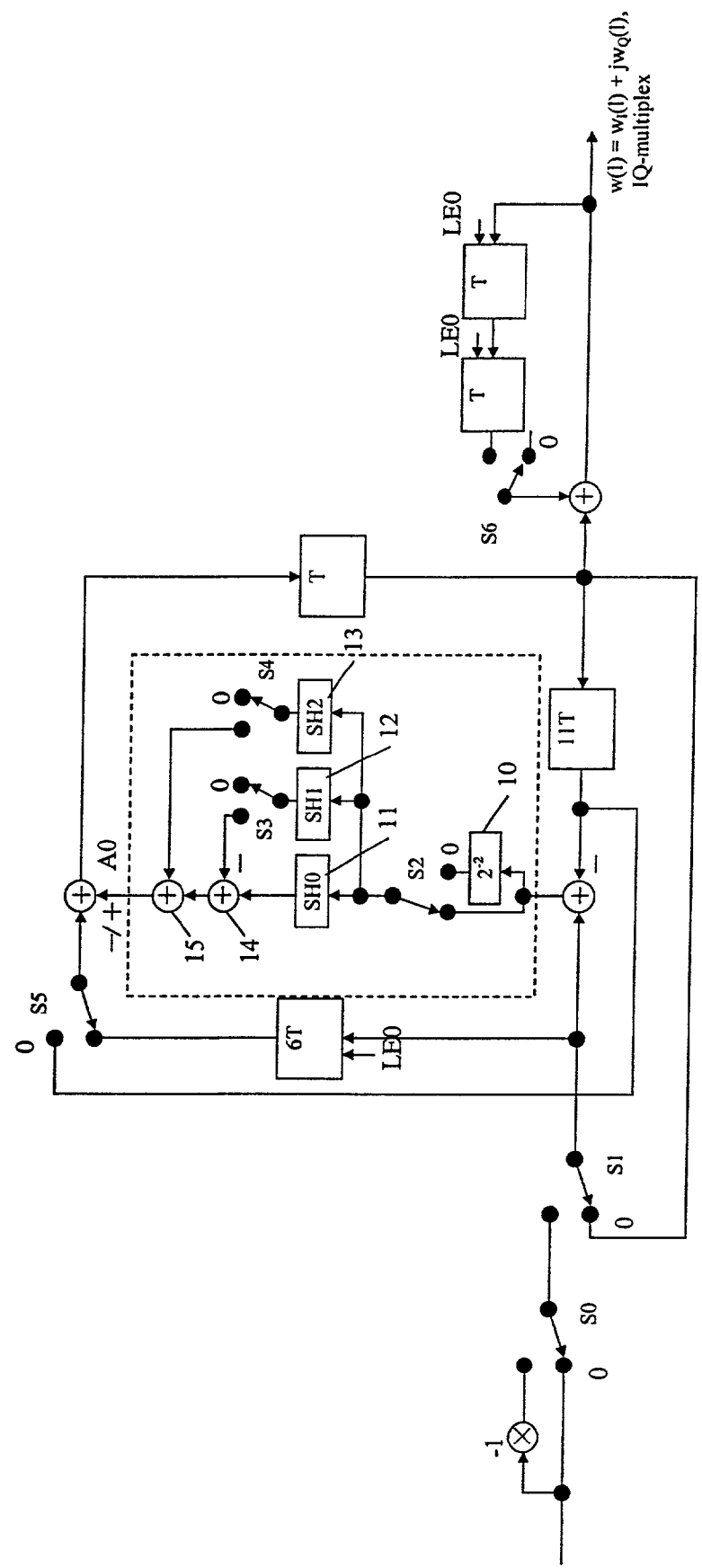
FIG. 9 shows an efficient realization of the IQ-filter shown in FIG. 8.

FIGS. 8 and 9 show an example of an IQ-filter according to the present invention comprising a polyphase filter with branch filters of order 2N according to the present invention. FIG. 8 shows that the polyphase filter of order 2N as shown in FIG. 3 is used as polyphase filter 22 according to the present invention as it is shown in FIG. 7. In FIG. 8 also quarter period sampling is used so that the carrier multiplication at the output of the polyphase filter according to the present invention as shown in FIG. 6 is not necessary.

In the shown example the decimation factor N is chosen to N=6. The coefficients of the IQ-filter are designed for a DAB-signal with a bandwidth of 1.536 MHz. The sampling frequency is chosen to 12.288 MHz and the center frequency of the input signal is chosen to $f_0=3.072$ MHz. With these values equation (22) is valid.

To decrease the hardware size, the coefficients $\alpha(k)$ and $\chi(k)$ are quantized in a way that they can be realized by shift registers, one adder and one subtracter. The following Table 1 shows the coefficients of the branch allpass filters:

TABLE 1

| r | $\alpha_r$ | | $-\chi_r$ | |
|---|---|---|---|---|
| 5 | 0.21875 | $2^{-2} - 2^{-5}$ | 0.138671875 | $2^{-3} + 2^{-6} - 2^{-9}$ |
| 4 | 0.40625 | $2^{-1} - 2^{-3} + 2^{-5}$ | 0.1796875 | $2^{-3} + 2^{-4} - 2^{-7}$ |
| 3 | 0.5546875 | $2^{-1} - 2^{-7} + 2^{-4}$ | 0.171875 | $2^{-3} + 2^{-4} - 2^{-6}$ |
| 2 | 0.6875 | $2^{-1} - 2^{-4} + 2^{-2}$ | 0.13671875 | $2^{-3} + 2^{-6} - 2^{-8}$ |
| 1 | 0.8125 | $1 - 2^{-2} + 2^{-4}$ | 0.08984375 | $2^{-4} + 2^{-5} - 2^{-8}$ |
| 0 | 0.9375 | $1 - 2^{-4}$ | 0.03125 | $2^{-5}$ |

The hardware size can further be decreased when the N time multiplexed allpass filters and order are realized by a second time multiplex so that the branch allpass filters of order 2N are realized by a time multiplexed allpass filter of order N. FIG. 9 shows a block diagram of the IQ-filter realized in a time-multiplex and multiplication coefficients that are realized by shift and add operation:

The "multiplier" which is realizing the first multiplier 5 as well as the second multiplier 9 comprises a first shift register 10 having a shift value of $2^{-2}$ that is receiving the multiplicand and an input selector switch S2 receiving the output value of said first shift register 10 at a first fixed input terminal and the multiplicand at a second fixed input terminal, a second shift register 11, a third shift register 12 and a fourth shift register 13 each having its input connected to the moveable output terminal of said input selector switch S2, a third subtracter 14 receiving the output value of said second shift register 11 at a first input receiving the minuend, a first output selector switch 33 having its moveable input terminal connected to the output of said third shift register 12, its first fixed output terminal runs free and its second fixed output terminal is connected to a second input of the third subtracter 14 receiving the subtrahend, a third adder 15 receiving the output value of said third subtracter 14 at a first input receiving the first summand and outputting the multiplied multiplicand, a second output selector switch 34 having its moveable input terminal connected to the output of said fourth register 13, its first fixed output terminal runs free and its second fixed output terminal is connected to a second input of the third adder 15 receiving the second summand.

Furtheron, to achieve the time multiplex, the incoming signal t(k) as it is shown in FIG. 6 is fed directly to a first fixed input terminal (which is marked with a 0 as all first fixed input terminals of the switches shown in the figures) of an input selector switch S0 and via a multiplicator multiplying with −1 to a second fixed terminal of this input selector switch S0. The movable terminal of the input selector switch S0 which is indicated by an arrow pointing to the first fixed terminal of the input selector switch is connected to the second fixed terminal of a first feedback selector switch S1. The movable output terminal of the first feedback selector switch S1 which is indicated by an arrow pointing to the first fixed terminal of said first feedback selector switch S1 is connected to the first delay element 1 with a delay time 6T, i. e. 2·3·T, that additionally comprises a latch enable input receiving the latch signal LE0 for the purpose of the time multiplex. The output of the first delay element 1 is fed via the second fixed terminal and the movable terminal of a second feedback selector switch S5 to the first input of the first adder 3. For the purpose of the time multiplex the first adder 3 is in this case an adder-subtracter and therewith the first input receives either the first summand or the minuent according to the respective function of the adder-subtracter 3. The output of the adder-subtracter 3 is fed to a first part 2a of the second delay element that has a delay T which provides the output signal u(k) of the polyphase filter 22 according to the present invention at its output. This output signal is fed to the first fixed input terminal of the first input selector switch S1 and also to a second part 2b of the second delay element having a delay 11T. The output of this delay element 2b is supplied to the first fixed terminal of the second feedback selector switch S5 and as subtrahent to the first subtracter 4 which receives the output signal of the first feedback selector switch S1 as minuent. The difference calculated by the first subtracter 4 gets multiplied with a respective coefficient α(k) or χ(k) as described above before it is supplied as second summand or as subtrahent to the adder-subtracter 3.

As mentioned above, the effient IQ-filter realization shown in FIG. 9 has its sampling rate decimation factor of N=6 and the N allpass filters $2N^{th}$ order are realized time-multiplexed. Therefore, one complex output sample has to be processed in 12 output clock cycles, i. e. $f_c=2f_s=2·6·f_s'$. The signal A(k) is periodic in 2 output clock samples. Therefore, the states of the IQ-filter are periodic in 24 clock cycles $f_c$. Table 2 below describes for every of the 24 different internal states of the IQ-filter the states of the switches that allabled with S0, S1, S2, S3, S4, S5, and S6 in the figures, the latch enable signal LE0 which is active high and the shift values of the shift registers SH0, SH1, and SH2. States that are not relevant and therefore don't care are marked by dc. Output signals w that are not defined are marked by nd.

TABLE 2

| State | S0 | | S1 | S2 | S3 | S4 | S5 | S6 | SH0 | SH1 | SH2 | LE0 | A0 | W |
|---|---|---|---|---|---|---|---|---|---|---|---|---|---|---|
| 0 | 0 | 0 | 1 | 1 | 1 | 0 | 1 | 1 | 0 | 2 | dc | 1 | + | Q(1 − 1) |
| 1 | dc | | 0 | 0 | 0 | 0 | 0 | 0 | 3 | dc | dc | 0 | − | nd |
| 2 | 0 | 1 | 1 | 1 | 1 | 1 | 1 | 0 | 0 | 0 | 2 | 1 | + | nd |
| 3 | dc | | 0 | 0 | 1 | 1 | 0 | 0 | 2 | 4 | 1 | 0 | − | nd |
| 4 | 1 | 1 | 1 | 1 | 1 | 1 | 1 | 0 | 1 | 2 | 0 | 1 | + | nd |
| 5 | dc | | 0 | 0 | 1 | 1 | 0 | 0 | 1 | 4 | 2 | 0 | − | nd |
| 6 | 1 | 0 | 1 | 1 | 1 | 1 | 1 | 1 | 5 | 2 | 1 | + | nd |
| 7 | dc | | 0 | 0 | 1 | 1 | 0 | 0 | 1 | 2 | 0 | 0 | − | nd |
| 8 | 0 | 0 | 1 | 1 | 1 | 1 | 1 | 1 | 1 | 3 | 1 | + | nd |
| 9 | dc | | 0 | 0 | 1 | 1 | 0 | 0 | 1 | 3 | 0 | 0 | − | nd |
| 10 | 0 | 1 | 1 | 1 | 1 | 0 | 1 | 1 | 2 | 3 | dc | 1 | + | I(1) |
| 11 | dc | | 0 | 0 | 1 | 1 | 0 | 0 | 1 | 5 | 2 | 0 | − | nd |
| 12 | 1 | 1 | 1 | 1 | 1 | 0 | 1 | 1 | 0 | 2 | dc | 1 | + | Q(1) |
| 13 | dc | | 0 | 0 | 0 | 0 | 0 | 0 | 3 | dc | dc | 0 | − | nd |
| 14 | 1 | 0 | 1 | 1 | 1 | 1 | 1 | 0 | 0 | 0 | 2 | 1 | + | nd |

TABLE 2-continued

| State | S0 | S1 | S2 | S3 | S4 | S5 | S6 | SH0 | SH1 | SH2 | LE0 | A0 | W |
|---|---|---|---|---|---|---|---|---|---|---|---|---|---|
| 15 | dc | | 0 | 0 | 1 | 1 | 0 | 0 | 2 | 4 | 1 | 0 | − | nd |
| 16 | 0 | 0 | 1 | 1 | 1 | 1 | 0 | 1 | 2 | 0 | 1 | + | nd |
| 17 | dc | | 0 | 0 | 1 | 1 | 0 | 0 | 1 | 4 | 2 | 0 | − | nd |
| 18 | 0 | 1 | 1 | 1 | 1 | 1 | 1 | 1 | 5 | 2 | 1 | + | nd |
| 19 | dc | | 0 | 0 | 1 | 1 | 0 | 0 | 1 | 2 | 0 | 0 | − | nd |
| 20 | 1 | 1 | 1 | 1 | 1 | 1 | 1 | 1 | 1 | 3 | 1 | + | nd |
| 21 | dc | | 0 | 0 | 1 | 1 | 0 | 0 | 1 | 3 | 0 | 0 | − | nd |
| 22 | 1 | 0 | 1 | 1 | 1 | 0 | 1 | 1 | 2 | 3 | dc | 1 | + | I(1 + 1) |
| 23 | dc | | 0 | 0 | 1 | 1 | 0 | 0 | 1 | 5 | 2 | 0 | − | nd |

Depending on the sideband that is required for the IQ-generation, the switch S0 is switched according to the left or right states that are described in the column of S0 in Table 2.

Preferably the filter can be used in a combined DAB/FM/AM-receiver and in case of DAB-reception, the input signal with a center frequency of $f_0=3.072$ MHz is sampled with a sampling rate of $f_s=12.288$ MHz, in case of FM-reception, the input signal with a center frequency of $f_0=10.75$ MHz is sampled with a sampling rate of $f_s=6.144$ MHz and in the case of AM-reception, the input signal with a center frequency of $f_0=455$ KHz is sampled with a sampling rate of $f_s=2.048$ MHz.

A digital IQ-filter according to the present invention has a linear phase response in the passband and high suppression of mirrored frequencies, since frequency modulated signals are sensitive against group delay distorsions which are caused by filters with non-linear phase in the passband.

As can be seen, the realization of the IQ filter according to the present invention is highly efficient, since only five adders and no multipliers are required. Therefore, the digital generation of a complex baseband signal in combination with noise shaping and neighbour channel suppression with a polyphase filter according to the present invention has low realization costs.

The invention claimed is:

1. A polyphase filter having N branch allpass filters of order x·N that filter an input signal, said polyphase filter comprising:
   a structure of an allpass filter of order x comprising delay elements with a delay of N and at least one multiplier, wherein delay elements with a delay of N decrease a sampling rate of each of the N branch allpass filters of order x·N,
   wherein the sampling rate $fS'=fs/N$, with fs being the sampling rate of the input signal, for each of the N branch allpass filters of order x·N, where x is an integer number and N is a decimation factor of the polyphase filter; and
   wherein said polyphase filter increases a number of Intermediate Frequencies (IF) utilized in selecting the sampling rate.

2. The polyphase filter according to claim 1, wherein said at least one multiplier comprises N time-multiplexed multiplication coefficients that are used in a predetermined order.

3. The polyphase filter according to claim 2, wherein said at least one multiplier has quantized coefficients so that said at least one multiplier is realized by at least one shift register, at least one adder or at least one subtracter.

4. The polyphase filter according to claim 3, wherein said at least one multiplier comprises:
   a first shift register that has a shift value of 2 and that receives a multiplicand and,
   an input selector switch that receives an output value of said first shift register at a first fixed input terminal and the multiplicand at a second fixed input terminal,
   a second shift register, a third shift register and a fourth shift register, an input of each of the second, third and fourth shift registers being connected to a moveable output terminal of said input selector switch,
   a third subtracter that receives the output value of said second shift register at the first fixed input terminal receiving a minuend,
   a first output selector switch having a moveable input terminal connected to an output of said third shift register and the second fixed output terminal is connected to a second input of the third subtracter that receives a subtrahend,
   a third adder tat receives the output value of said third subtracter and that receives a first summand, and outputs the multiplied multiplicand,
   a second output selector switch having a moveable input terminal connected to an output of said fourth shift register and the second fixed output terminal is connected to a second input of the third adder that receives a second summand.

5. The polyphase filter according to claim 1, wherein the structure of the allpass filter comprises:
   a first delay element with the delay of N that receives the input signal;
   a first adder that receives an output signal of said first delay element at a first input for a first summand;
   a second delay element with the delay of N that receives a sum produced by said first adder;
   a first subtracter that receives the input signal at the first input for a minuend and the output signal of the second delay element at a second input for a subtracter; and
   a first multiplier that receives a calculated difference of the first substracter, multiplies said calculated difference of first subtracter with a predetermined multiplication co-efficient and outputs a calculated product to the second input of the first adder that receives a second summand, wherein
   if x equals to 1, the sum produced by said first adder is accumulated to build the output signal from the branch alipass filters.

6. The polyphase filter according to claim 5, wherein structure of the allpass filter further comprises:
   a second adder that receives the output signal of the second delay element at the first input for the first summand;
   a third delay element with the delay of N that receives the sum produced by said second adder;

a second subtracter that receives the sum produced by said first adder at the first input for the minuend and the output signal of the third delay element at the second input for the subtrahend; and a second multiplier that receives the calculated difference of the second subtracter, multiplies said calculated difference of the second subtracter with a predetermined multiplication coefficient and outputs the calculated product to the second input of the second adder that receives the second summand, wherein if x equals to 2, the sum produced by said second adder is accumulated to build the output signal from the branch alipass filters.

7. The polyphase filter according to claim 1, wherein the polyphase filter of order x·N with x=a is utilized in a time multiplex and uses a clock frequency fc=a·fs, where x and a are integer numbers.

8. An IQ-generator comprising:

a multiplier for multiplying an incoming sampled bandpass signal by a signal $A(k)=(-1)^{floor(k/N)}$ and outputting a signal t(k); and a polyphase filter having N branch alipass filters of order x·N, having an input coupled to the output of said multiplier, and having a sampling frequency, where k is an input value, N is a decimation factor of the polyphase filter, x is an integer number, A(k) is a first signal and floor(x) is the greatest integer function, which gives the largest integer less than or equal to x; and wherein said polyphase filter increases a number of Intermediate Frequencies (IF) utilized in selecting the sampling frequency.

9. The IQ-generator according to claim 8, wherein the output signal of the polyphase filter having N branch alipass filters is multiplied by a signal $B(k)·\cos(22\pi fo/fs·k)$ to calculate an I-component of a complex baseband signal and by a signal $B(k)·\sin(2\pi fo/fs·k)$ to calculate a Q-component of the complex baseband signal with $A(k)=B(k)=(-1)^{floor(k/N)}$ where fa is the sampling frequency, fo is a center frequency of the input signal, n is an integer number in the range of [−N/2 . . .N/2] and B(k) is a second signal.

10. The IQ-generator according to claim 8, wherein the incoming sampled bandpass signal is multiplied by the signal $A(k)=(-1)^{floor(k/N)}$ before being supplied as the input signal to the polyphase filter consisting of N branch ailpass filters of order x·N, wherein the polyphase filter filters an I-component and a Q-component of a complex baseband signal.

* * * * *